(12) United States Patent
Chen et al.

(10) Patent No.: US 7,119,565 B2
(45) Date of Patent: Oct. 10, 2006

(54) CHIP CARRIER AND METHOD FOR TESTING ELECTRICAL PERFORMANCE OF PASSIVE COMPONENT

(75) Inventors: Chien-Te Chen, Taichung (TW); Chien-Ping Huang, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 0 days.

(21) Appl. No.: 10/728,304

(22) Filed: Dec. 3, 2003

(65) Prior Publication Data

US 2004/0190273 A1 Sep. 30, 2004

(30) Foreign Application Priority Data

Mar. 31, 2003 (TW) .............................. 92107226 A (51) Int. Cl.
*G01R 31/02* (2006.01)
(52) U.S. Cl. ..................................................... 324/755
(58) Field of Classification Search ................ 324/755, 324/765, 158.1, 754, 756; 174/256, 260; 257/789, 758; 361/761–765, 783
See application file for complete search history.

(56) References Cited

U.S. PATENT DOCUMENTS 5,698,895 A * 12/1997 Pedersen et al. ............ 257/665
6,078,186 A * 6/2000 Hembree et al. ............ 324/755
6,486,528 B1 * 11/2002 Pedersen et al. ............ 257/529
6,577,490 B1 * 6/2003 Ogawa et al. ............ 361/306.1
6,646,349 B1 * 11/2003 Pu et al. ..................... 257/758
6,756,663 B1 * 6/2004 Shiraishi et al. ............ 257/686
6,819,127 B1 * 11/2004 Hembree .................... 324/755

* cited by examiner

*Primary Examiner*—Minh Nhut Tang
*Assistant Examiner*—Tung X. Nguyen
(74) *Attorney, Agent, or Firm*—Peter F. Corless; Steven M. Jensen; Edwards Angell Palmer & Dodge, LLP (57) ABSTRACT

A chip carrier for testing electrical performance of a passive component includes: a core layer having a plurality of conductive traces on a surface thereof; at least one first trace connected with the passive component and having a first predetermined position and two ends, wherein the two ends are respectively electrically connected to a first bond finger on the surface of the chip carrier and to a first ball pad on an opposite surface of the chip carrier; at least one second trace not connected with the passive component and having two ends and a second predetermined position located on the same surface as the first predetermined position, one end of the second trace being electrically connected to a second ball pad located on the same surface as the first ball pad; and a solder mask layer applied over the conductive traces, with the first and second predetermined positions exposed.

17 Claims, 7 Drawing Sheets

CHIP CARRIER AND METHOD FOR TESTING ELECTRICAL PERFORMANCE OF PASSIVE COMPONENT

FIELD OF THE INVENTION

The present invention relates to chip carriers and methods for testing passive components, and more particularly, to a chip carrier and a method for testing electrical performance of a passive component, which would not have to modify the structure or design of the chip carrier and can allow the testing method to be rapidly performed.

BACKGROUND OF THE INVENTION

Ball grid array (BGA) technology is getting commonly applied to the semiconductor package industry by virtue of having more I/O (input/output) connections, better heat dissipation efficiency, more desirable electrical performance and better surface mount reliability than predecessor package structures, thereby making BGA technology become a mainstream developing trend in the relevant fields. In order to enhance the electrical performance of a BGA semiconductor package, for example to eliminate noise signals, it is usually to mount one or more passive components such as capacitor, resistor, and inductor, on a chip carrier such as substrate. However, due to relatively lower testability of the passive components and thereby hard to find suitable testing machines, it makes testing of the passive component difficult to implement and sets undesirable limitation on the test performance and yield of the BGA semiconductor package.

Figure 6A:
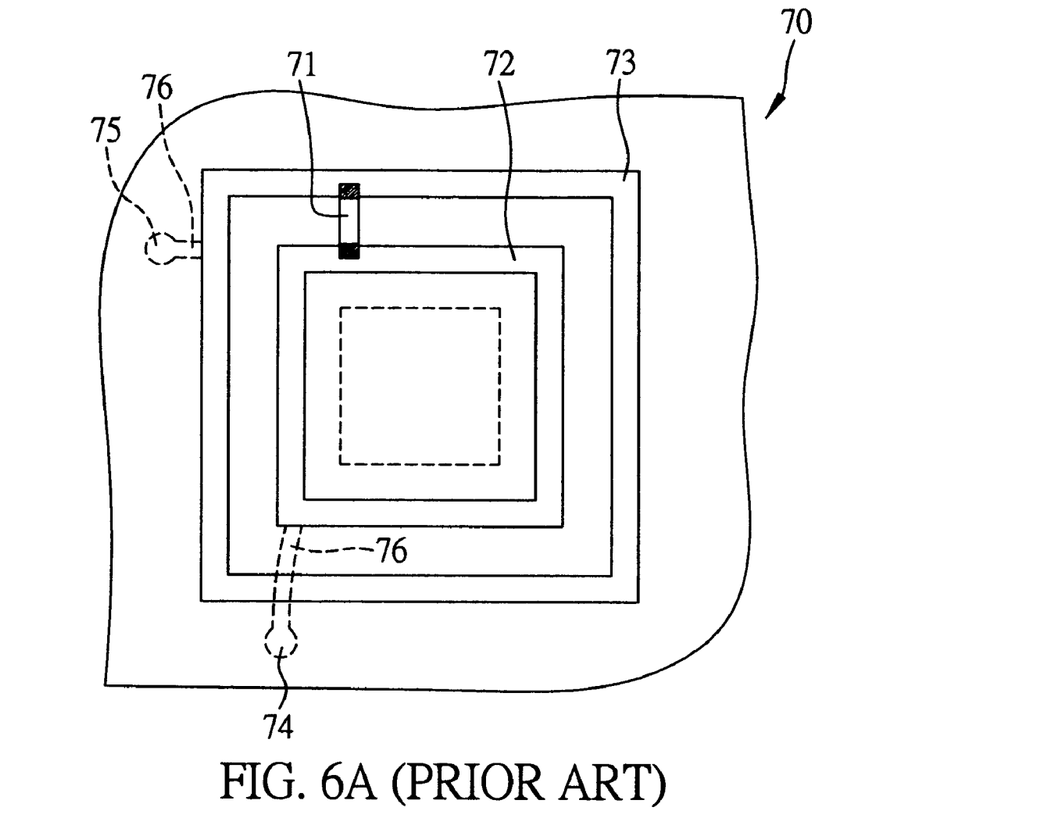
FIG. 6A (PRIOR ART) is a schematic diagram showing a top view of a conventional chip carrier having a capacitor thereon.
Figure 6B:
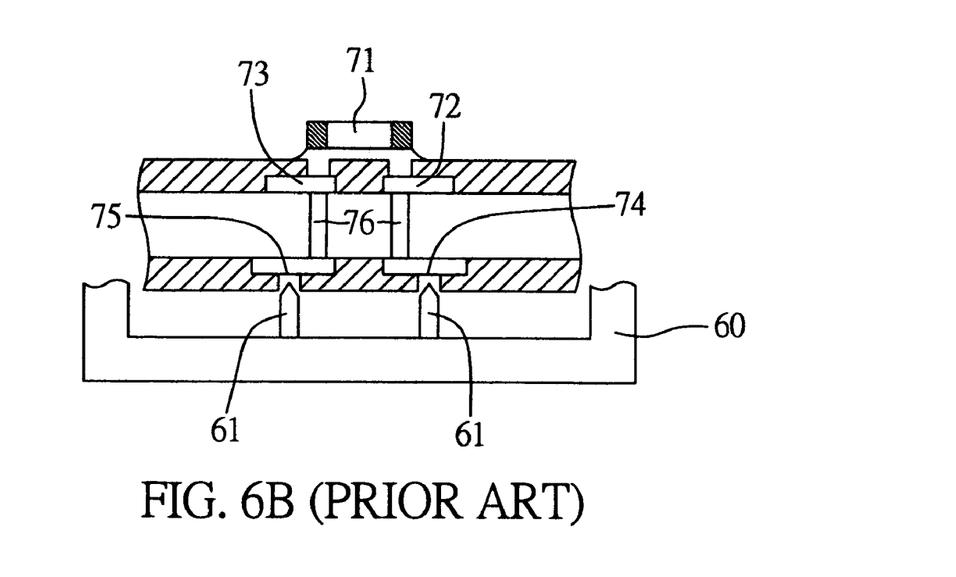
FIG. 6B (PRIOR ART) is a schematic diagram showing a side view of the conventional chip carrier having a capacitor thereon.

Generally, for mounting a passive component on a package substrate, the conventional surface mount technology (SMT) is employed to attach the passive component to predetermined conductive traces formed on the substrate. After the passive component successfully passes a test of electrical performance, die bonding, wire bonding, encapsulation and ball deposition processes are then carried out to complete the fabrication of a BGA semiconductor package. In the case of the passive component being a capacitor, it is usually bridged on the substrate in such a manner that two ends of the capacitor are respectively connected to a ground ring and a power ring formed on the substrate. As shown in FIG. 6A, the two ends of the capacitor 71 have different electrical properties and can be tested through test contacts of a ground pad 74 electrically connected to the ground ring 72 by a conductive via 76, and a power pad 75 electrically connected to the power ring 73 by another conductive via 76. As shown in FIG. 6B, a set of probe heads 61 on a test socket 60 are respectively in contact with the ground pad 74 and the power pad 75 to allow the test of electrical performance for the passive component 71 to be easily conducted.

Figure 7A:
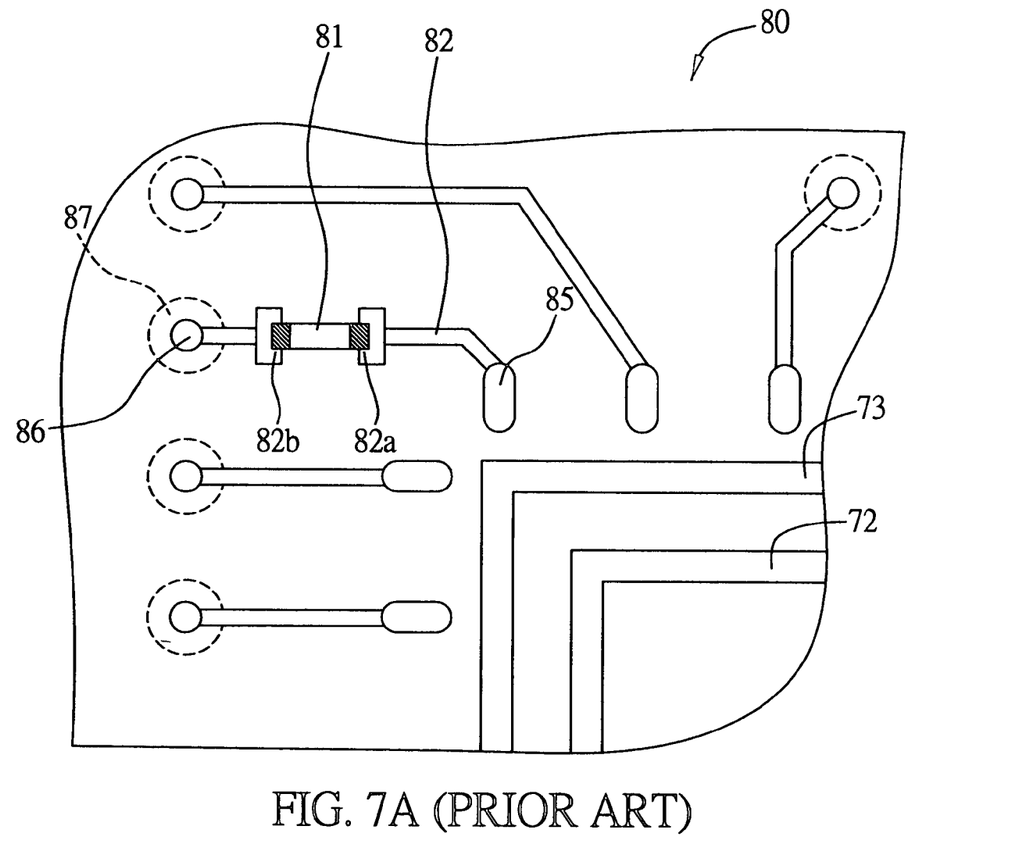
FIG. 7A (PRIOR ART) is a schematic diagram showing a top view of a conventional chip carrier having a resistor or inductor thereon.
Figure 7B:
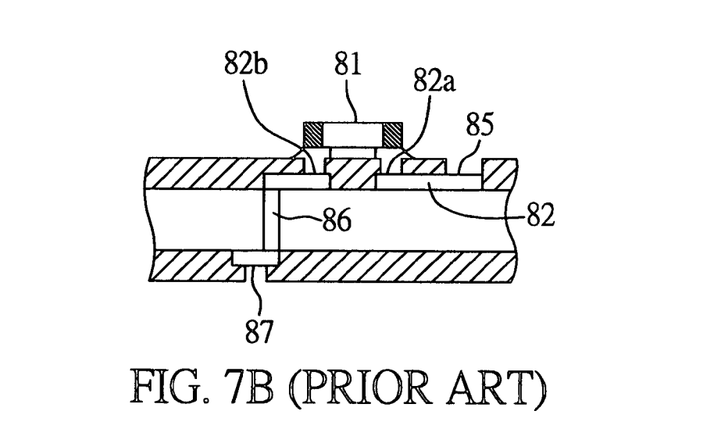
FIG. 7B (PRIOR ART) is a schematic diagram showing a side view of the conventional chip carrier having a resistor or inductor thereon.
Figure 8:
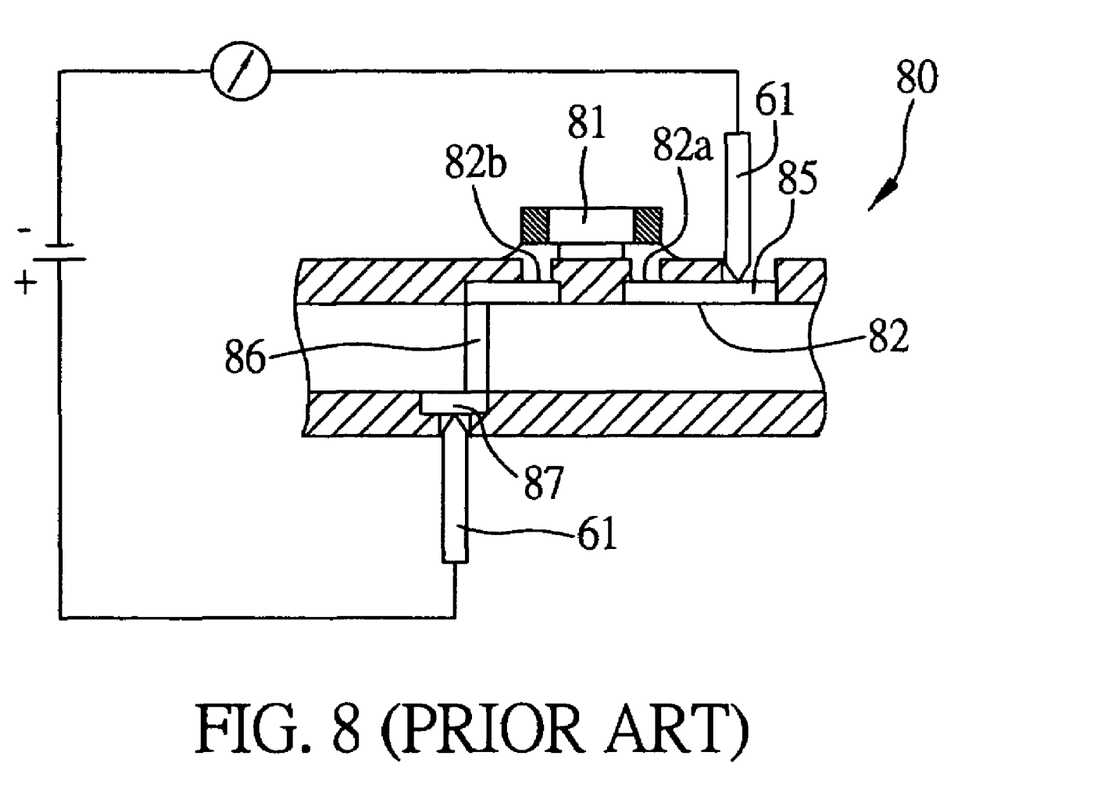
FIG. 8 (PRIOR ART) is a schematic diagram showing the conventional chip carrier having a resistor or inductor thereon which undergoes an electrical performance test.

In the case of the passive component being a resistor or inductor, however, the resistor or inductor once being mounted on the substrate is hard to undergo a test of electrical performance as the resistor or inductor is connected to the conductive trace on the substrate in a serial manner. As shown in FIG. 7A, the resistor 81 is serially connected on a first contact 82a and a second contact 82b of a trace 82, wherein the first contact 82a formed on a first end of the trace 82 is electrically connected to a bond finger 85, and the second contact 82b formed on a second end of the trace 82 is electrically connected to a ball pad 87, such that the chip can be electrically connected to an external device by solder balls. As shown in FIG. 7B, the bond finger 85 is located on a top surface of the substrate 80 and bonded with a bonding wire formed on a bond pad of the chip, and the second end of the trace 82 is connected through a conductive via 86 to the ball pad 87 on a bottom surface of the substrate 80. Thereby, if the resistance or bondability of the resistor 81 intends to be measured, it needs to use the bond finger 85 on the top surface of the substrate 80 and the ball pad 87 on the bottom surface of the substrate 80 respectively as test points in place of the first contact 82a and the second contact 82b, and allow a set of test probe heads 61 to respectively contact the bond finger 85 and the ball pad 87. However, as shown in FIG. 8, the two probe heads 61 are respectively placed above and below the substrate 80, thus not consistent with the current automatic and standard probe testing system. And this testing method can only test one passive component in one time, and fails to perform quick tests for a large amount of passive component as a conventional testing system having an array of probe heads formed on the same plane.

Further, the testing method shown in FIG. 8 needs to contact the probe head 61 with the bond finger 85 on the top surface of the substrate 80. The location of bond finger of the conductive trace varies with different functions of the package, and is not regularly arranged as the case of the ball pad 87 on the bottom surface of the substrate 80. As such, during the test performance, the size of probe heads is hard to be standardized but depends on the package in different devices. Moreover, the irregular arrangement of bond finger may lead to inaccurate positioning of the probe head and result in undesirably erroneous test results.

The above testing method, with the probe head directly contacting the bond finger on the top surface of the substrate, further may degrade quality and yield of the package as a sharp tip of the probe head would easily damage the Ni/Au layer on the surface of bond finger, thereby deteriorate the quality of bond finger, which leads to incomplete bonding of gold wires in a subsequent wire-bonding process and produces a problem of poor electrical performance.

Accordingly, in order to solve the drawbacks encountered during the test of electrical performance for resistor and inductor in the use of the above conventional technology, the structure or design of the substrate needs to be changed, thereby significantly increasing the associated costs. Therefore, the problem to be solved herein is to provide a chip carrier and a testing method using the same, which do not need to alter the structure or design of the chip carrier, and which can quickly perform standard tests for the passive component and can be suitably used with chip carrier arrangement in different device without affecting the product yield.

SUMMARY OF THE INVENTION

An objective of the present invention is to provide a chip carrier and a method for testing electrical performance of a passive component, which would not have to modify the structure or design of the chip carrier.

Another objective of the present invention is to provide a chip carrier and a method for testing electrical performance of a passive component, which can be applied to different electronic devices.

Still another objective of the present invention is to provide a chip carrier and a method for testing electrical performance of a passive component, which can be used for automatic tests.

A further objective of the present invention is to provide a chip carrier and a method for testing electrical performance of a passive component, which can be used for rapid and standard tests.

A further objective of the present invention is to provide a chip carrier and a method for testing electrical performance of a passive component, which would not require the contact with bond fingers.

In accordance with the above and other objectives, the present invention proposes a chip carrier for testing electrical performance of a passive component, comprising: a core layer having a plurality of conductive traces formed on at least one surface thereof, the conductive traces comprising: at least one first trace connected with the passive component and having a first predetermined position and two ends, wherein the two ends are respectively electrically connected to a first bond finger formed on the surface, mounted with the passive component, of the chip carrier, and to a first ball pad formed on an opposite surface of the chip carrier, and wherein the first predetermined position and the first bond finger are located on the same side relative to the passive component; and at least one second trace free of connection with the passive component and having two ends and a second predetermined position located on the same surface as the first predetermined position, wherein one of the ends of the second trace is electrically connected to a second ball pad located on the same surface as the first ball pad; and a solder mask layer applied over the conductive traces and formed with a plurality of openings for at least exposing the first predetermined position and second predetermined position.

The present invention further provides a method for testing electrical performance of a passive component, for use with a chip carrier having a core layer on which a plurality of conductive traces are formed, the conductive traces comprising at least one first trace predetermined to be connected with the passive component. This method comprises the steps of: setting a first predetermined position on the first trace, and allowing two ends of the first trace to be respectively electrically connected to a first bond finger formed on a surface, mounted with the passive component, of the chip carrier, and to a first ball pad formed on an opposite surface of the chip carrier, wherein the first predetermined position and the first bond finger are located on the same side relative to the passive component; setting a second trace from the plurality of conductive traces and a second predetermined position on the second trace, wherein the second trace is predetermined free of connection with the passive component, and one end of the second trace is connected to a second ball pad formed on the same surface as the first ball pad; applying a solder mask layer over the conductive traces and forming a plurality of openings through the solder mask layer for at least exposing the first predetermined position and second predetermined position; mounting the passive component on the first trace; interconnecting the first predetermined position and second predetermined position via an electrically conductive material; and contacting two test heads respectively with the first ball pad and second ball pad, which are situated on the same surface of the chip carrier, to testing the electrical performance of the passive component.

The foregoing passive component is a resistor or inductor. The above-used electrically conductive material is a conductive jig made by conductive rubber, a conductive metal or other conductive material. The first predetermined position and the second predetermined position are each at least formed with a nickel/gold (Ni/Au) layer thereon, to respectively form a first short-circuit pad and a second short-circuit pad that are short-circuited by means of the electrically conductive material.

Therefore, according to the invention, one of the plurality of conductive traces is selected as the second trace, and the conductive jig is used to electrically connect the first short-circuit pad and the second short-circuit pad, so as to allow test contacts located at two ends of the passive component to be redistributed to the first ball pad and the second ball pad that are situated on the same surface of the chip carrier. Without contact with bond fingers, all standard electrical performance tests for resistors or inductors can be completed through the use of the regularly arranged ball pads. And the chip carrier is suitable for all different devices without having to modify the structure or design of the chip carrier, which overcomes the prior art limitation.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a chip carrier and a method for testing electrical performance of a passive component proposed in the present invention are described with reference to FIGS. 1 to 4 and 5A–5F.

Figure 1:
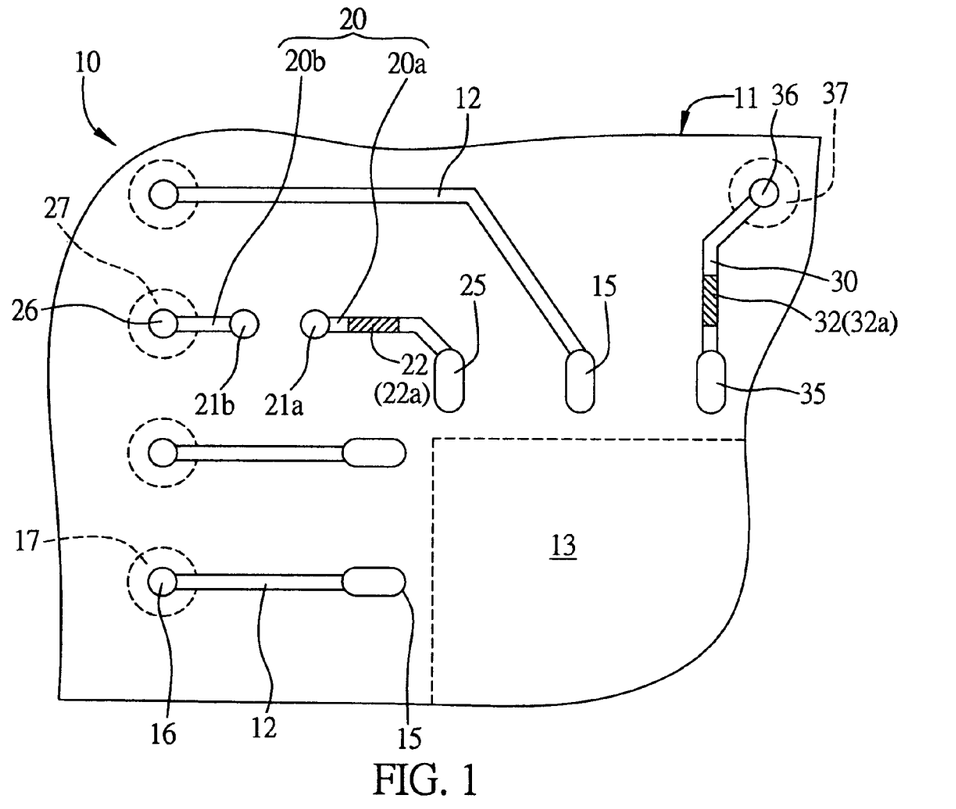
FIG. 1 is a schematic diagram showing a top view of a chip carrier according to a preferred embodiment of the invention.

FIG. 1 shows a top view of the chip carrier according to a preferred embodiment of the invention, which is a BGA (ball grid array) substrate 10 and can be a double-layer substrate or a multi-layer laminated substrate. The substrate 10 comprises: a core layer 11 made of FR4 resin, glass resin, BT (bismaleimide triazine) resin, epoxy resin, polyimide resin or cyanide resin; a plurality of patterned conductive traces 12 and a chip attach region 13 formed on a surface of the core layer 11; and a solder mask layer 14 applied over the conductive traces 12 for protecting the conductive traces 12 against external electrical interference. The plurality of conductive traces 12 each has one end formed as a bond finger 15 that can be electrically connected to a chip (not shown) and the other end electrically connected to a corresponding ball pad 17 formed on a bottom surface of the substrate 10 through a corresponding conductive via 16, such that an electrical connection can be established between the chip and an external device (not shown) through the conductive traces 12, conductive vias 16, ball pads 17, and solder balls (not shown) which are supposed to be deposited on the ball pads 17 and electrically connected to the external device.

Figure 2:
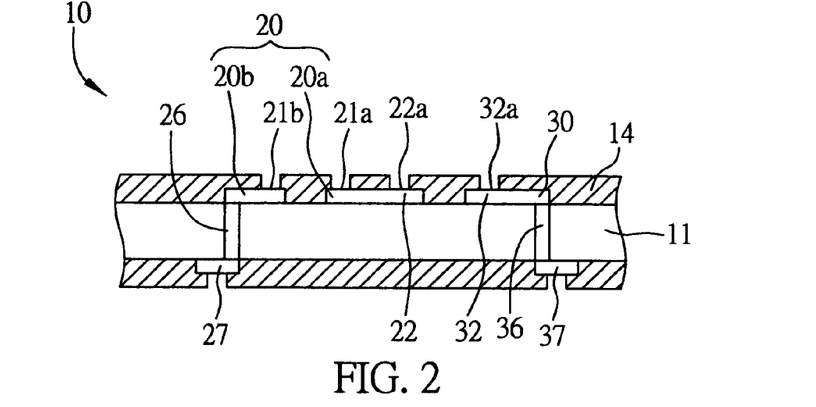
FIG. 2 is a schematic diagram showing a side view of the chip carrier according to the invention.

As shown in FIG. 2, the plurality of conductive traces 12 at least have a first trace 20 predetermined to be serially connected with a passive component (such as resistor or inductor, not shown) and a second trace 30 not connected with the passive component. The first trace 20 includes an inner portion 20a having one end formed as a first bond finger 25, and an outer portion 20b having one end electrically connected to a first ball pad 27 formed on the bottom surface of the substrate 10 through a conductive via 26. A first contact 21a and a second contact 21b are respectively formed at the other end of the inner portion 20a and of the outer portion 20b, such that a passive component (not shown) can be connected to the first and second contacts 21a, 21b and thus electrically connected to the inner portion 20a and the outer portion 20b, so as to establish an electrical connection between the chip and external device (not shown) via the passive component. The first trace 20 is defined with a first predetermined position 22 intended to form a first short-circuit pad 22a, wherein the first predetermined position 22 can be selected from any position on the inner portion 20a and is preferably spaced apart from the first bond finger 25 and the first contact 21a by a suitable distance. The second trace 30 can be selected from any conductive trace not in connection with the passive component and flexibly located relative to the first trace 20. Further, two opposite ends of the second trace 30 can respectively form a second bond finger 35 on a top surface of the substrate 10 and a second ball pad 37 on the bottom surface of the substrate 10. The second trace 30 is also defined with a second predetermined position 32 intended to form a second short-circuit pad 32a, and the second predetermined position 32 is flexibly located without particular limitation.

The solder mask layer 14, applied over the substrate 10 and conductive traces 12, is formed with a plurality of openings through the use of a mask to expose a plurality of predetermined positions on the conductive traces 12. The openings are each situated at one end of each of the conductive traces 12 to form bond fingers 15, 25 and 35 that are connected to bonding wires (not shown) on the chip. Moreover, the solder mask layer 14 is also formed with openings corresponding in position to the first contact 21a and second contact 21b of the first trace 20 which are exposed to be serially connected with the passive component by means of surface mount technology (SMT) in a later process so as to allow the passive component to be coupled to the inner portion 20a and outer portion 20b of the first trace 20. Besides, the solder mask layer 14 may further be formed with two openings respective for exposing the first predetermined position 22 and second predetermined position 32 of the first trace 20 and second trace 30 to thereby form the first short-circuit pad 22a and the second short-circuit pad 32a. The bond fingers of the conductive traces are made of at least one nickel/gold (Ni/Au) layer coated on the exposed ends of the conductive traces and thereby can be bonded with the gold-made bonding wires. The first short-circuit pad 22a and the second short-circuit pad 32a are similarly made of at least one Ni/Au layer plated on the first predetermined position 22 and the second predetermined position 32 respectively. The bond fingers and the first and second short-circuit pads 22a, 32a are fabricated by conventional technology which is not to be further detailed herein.

Figure 3:
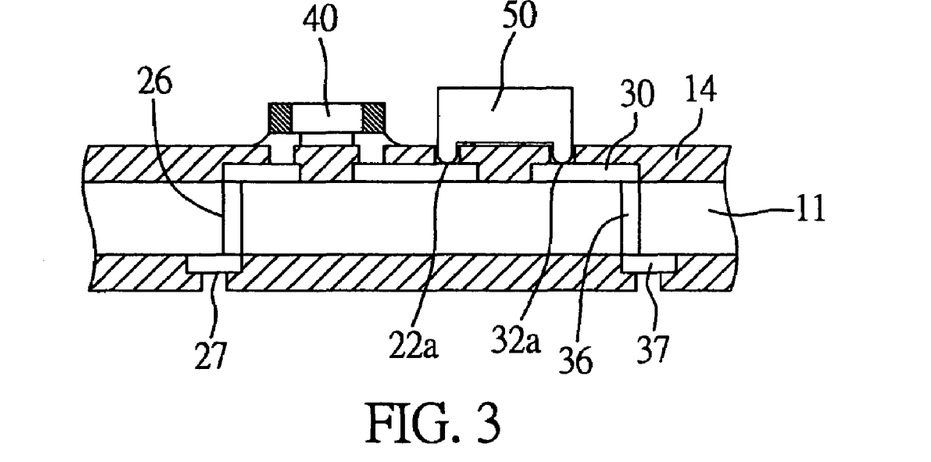
FIG. 3 is a schematic diagram showing an electrically conductive jig in contact with the chip carrier according to the invention.

As shown in FIG. 3 for the chip carrier according to this embodiment, if a passive component 40 such as resistor or inductor is serially connected to the first trace 20 by SMT, the first predetermined position 22 and the second predetermined position 32, which are exposed to outside of the solder mask layer 14 and form the first short-circuit pad 22a and the second short-circuit pad 32a, are electrically interconnected and thus lead to a short circuit between the first and second short-circuit pads 22a, 32a. As a result, the second trace 30 and the inner portion 20a of the first trace 20 are also short-circuited, making the second ball pad 37 of the second trace 30 serve as a test point in place of the first contact 21a of the first trace 20. Similarly, the first ball pad 27 acts as a test point through the conductive via 26 in place of the second contact 21b. Thereby, a test for electrical performance of the passive component 40 can be conducted via the first ball pad 27 and second ball pad 37 as the test points.

The foregoing short circuit between the first short-circuit pad 22a and the second short-circuit pad 32a can be mediated by an electrical connection. Further as shown in FIG. 3, a conductive jig 50 is placed on the solder mask layer 14 to cover and electrically contact the first short-circuit pad 22a and the second short-circuit pad 32a. The conductive jig 50 can be made of electrically conductive rubber, an electrically conductive metal, or other electrically conductive material. The conductive jig 50 undergoes a pressing process to be adapted to simultaneously contact the first short-circuit pad 22a and the second short-circuit pad 32a. The shape and location of the conductive jig 50 flexibly depend on the location of the first short-circuit pad 22a and second short-circuit pad 32a. In the case of the conductive jig 50 being a conductive metal block, it usually needs to change the position or shape of the conductive jig 50 according to different designs of a chip carrier used in different devices. If the conductive jig 50 is made of electrically conductive rubber, it possesses elasticity and thus can desirably contact the first short-circuit pad 22a and second short-circuit pad 32a that are changed in position in a chip carrier of different designs, thereby not needing to relocate the conductive jig 50 even for use with different chip carriers.

Figure 4:
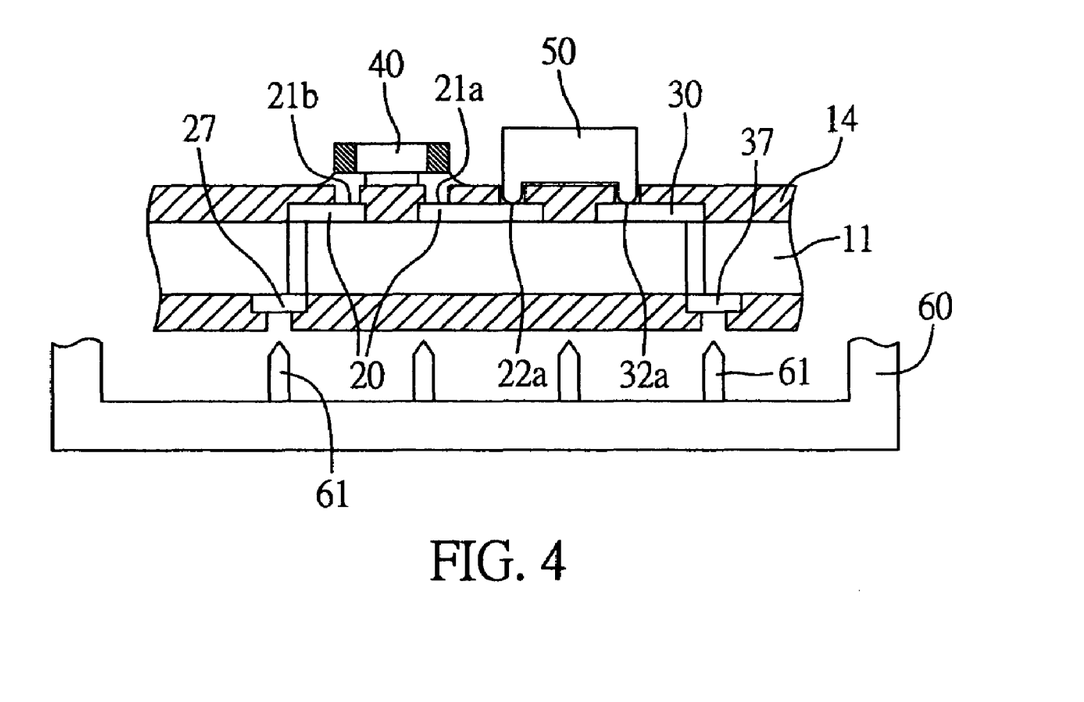
FIG. 4 is a schematic diagram showing the chip carrier according to the invention which undergoes an electrical performance test.

For performing a test of electrical performance of the passive component 40, as shown in FIG. 4, the substrate 10 is mounted on a conventional test socket 60, wherein the bottom surface of the substrate 10 having the array-arranged ball pads faces toward a surface of the test socket 60 having a set of test probe heads 61. The test probe heads 61 having a standard probe pitch respectively contact the first ball pad 27 and second ball pad 37 that act as test points to perform the test for the passive component 40, while the test probe heads 61 are not required to touch the bond fingers 15, 25 and 35 of the substrate 10 (see FIG. 1), thereby not affecting the quality of bond fingers. The location of the second trace 30 or the second ball pad 37 can be selected in accordance with the first ball pad 27 and the probe pitch of the test socket 60 so as to facilitate rapid and accurate test implementation. Alternatively, the probe pitch can be adjusted in accordance with the positions of ball pads intended to be tested on the chip carrier so as to achieve commercially rapid and batch test performance.

When the electrical performance of the passive component 40 on the chip carrier is tested and the conductive jig 50 is removed, it completes the design task of the first short-circuit pad 22a and second short-circuit pad 32a exposed to outside of the solder mask layer 14, and the chip carrier is readily subject to a subsequent encapsulating process where the chip carrier is encapsulated by an encapsulation body and protected against short-circuit or other reliability problems.

Therefore, the chip carrier for testing electrical performance of a passive component according to the invention employs the provision of the first predetermined position 22 and second predetermined position 32 to form a short circuit, for removing the limitation on testing electrical performance of the passive component according to conventional technology. In the case of more than one passive components mounted on the chip carrier, the same method can be used to form a plurality of short-circuit pads on conductive traces that are close to the conductive traces connected with the passive components, wherein the short-circuit pads are used to form a short circuit for the testing of electrical performance. Alternatively, a single second trace on the chip carrier can be selected, and a conductive jig having relatively larger surface area is used to form the electrical connection between the second trace and all passive components intended to be tested. At this time, test ball pads of the passive components can be selected in order to serve as test points that are tested through the use of a ball pad of the second trace as another test point. This arrangement can reduce the number of short-circuit pads required and the cost of changing or replacing the conductive jig.

Figure 5A:
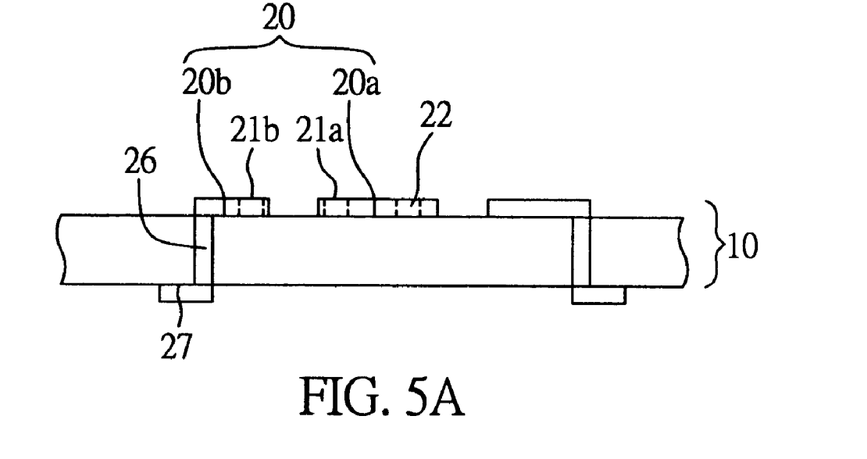
FIGS. 5A to 5F are schematic diagrams showing procedural steps of a testing method for electrical performance according to the invention.
Figure 5B:
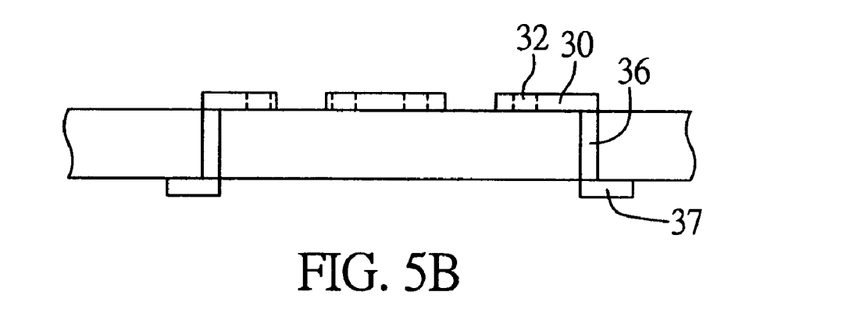
Figure 5C:
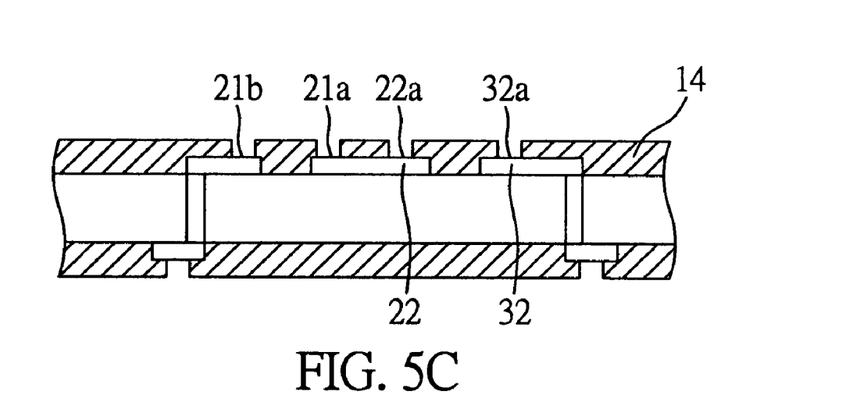
Figure 5D:
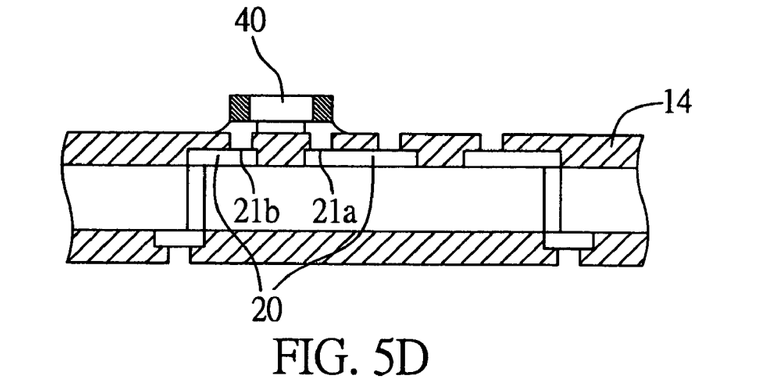
Figure 5E:
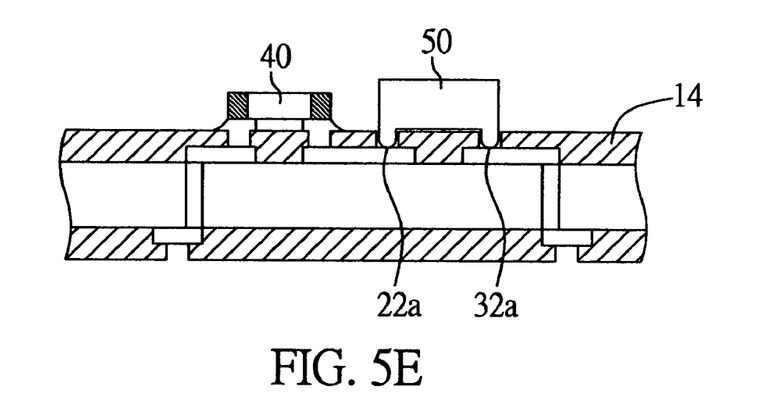
Figure 5F:
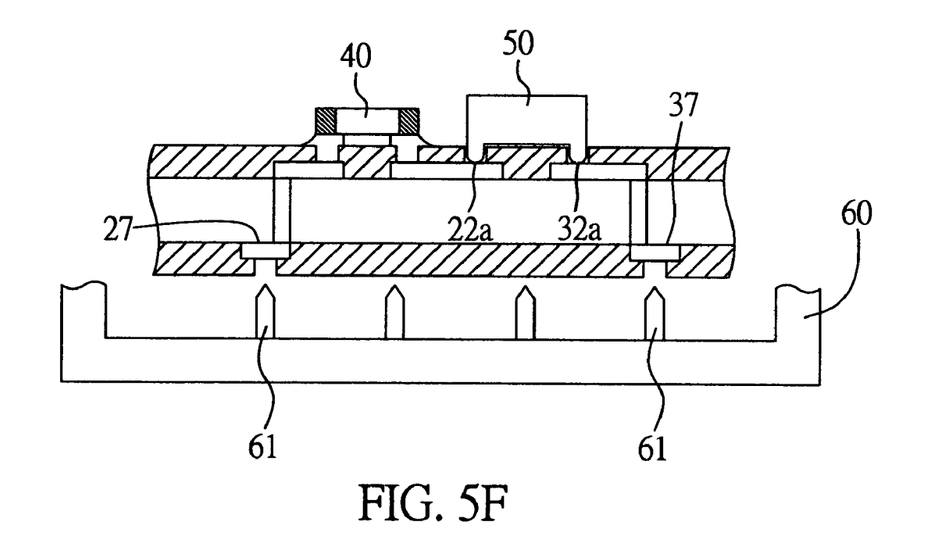

FIGS. 5A to 5F show the steps of a method for testing electrical performance of a passive component according the invention. As shown in FIG. 5A, the first step is to prepare a chip carrier such as substrate 10 on which a plurality of conductive traces are formed, wherein the conductive traces have at least one first trace 20 predetermined to be connected with the passive component (not shown). A first predetermined position 22 is set on an inner portion 20a of the first trace 20 and intends to form a first short-circuit pad, wherein two ends of the inner portion 20a of the first trace 20 can respectively form a first contact 21a for the passive component and a first bond finger (not shown) formed on a top surface of the substrate 10. Two ends of an outer portion 20b of the first trace 20 can respectively form a second contact 21b and a first ball pad 27 on a bottom surface of the substrate 10. Referring to FIG. 5B, then a second trace 30 not connected with the passive component is selected from the conductive traces. A second predetermined position 32 is set on the second trace 30 and intends to form a second short-circuit pad, wherein one end of the second trace 30 can form a second ball pad 37 on the bottom surface of the substrate 10. As shown in FIG. 5C, a solder mask layer 14 is applied over the conductive traces and is formed a plurality of openings by the use of a photo mask to expose ends of the conductive traces including the first trace 20 and the second trace 30, making the exposed ends form bond fingers (not shown), and also to expose the first contact 21a and the second contact 21b of the first trace 20 for serially connecting the passive component, as well as to expose the first predetermined position 22 and the second predetermined position 32 to respectively form the intended first short-circuit pad 22a and the intended second short-circuit pad 32a. As shown in FIG. 5D, the passive component 40 is serially connected with the first contact 21a and the second contact 21b of the first trace 20 to interconnect the inner portion 20a and the outer portion 20b. As shown in FIG. 5E, a conductive jig 50 is used to connect the first short-circuit pad 22a and the second short-circuit pad 32a, which are exposed to outside of the solder mask layer 14, to form a short circuit. Finally as shown in FIG. 5F, the substrate 10 is mounted on a test socket 60, allowing a set of test probe heads 61 to contact the first ball pad 27 and the second ball pad 37 on the bottom surface of the substrate 10 to test the electrical performance of the passive component 40 by means of a circuit through the first short-circuit pad 22a, the second short-circuit pad 32a and the test probe heads 61.

The above passive component 40 is attached to the exposed first contact 21a and second contact 21b by the conventional SMT. The bond fingers of the conductive traces and the first and second short-circuit pads 22a, 32a are all formed by plating a Ni/Au layer on the exposed ends of the conductive traces and the exposed first and second predetermined positions 22, 32 respectively. These technology and technical processes are known in the art thereby not further to be detailed herein.

Therefore, the testing method according to the invention can use the array-arranged ball pads on the bottom surface of the substrate and test probe heads of the test socket to test the electrical performance of the passive component such as resistor and inductor. Further, the testing method can quickly complete the standard tests of electrical performance for one or more passive components on different chip carrier or substrate having different circuit layout by means of the predetermined position on the second trace or the pitch of the probe heads.

In conclusion, the chip carrier and method for testing electrical performance of a passive component according to the invention can implement quick and standard tests of electrical performance without changing the structure or design of the chip carrier or substrate. Moreover, the test performance would not be affected by variable chip carriers in different devices. Further, the use of the chip carrier and method according to the invention can prevent the test probe heads from contacting bond fingers of the chip carrier during the test, thereby assuring quality and yield of the chip carrier.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A chip carrier for testing electrical performance of a passive component, having at least one passive component mounted on a surface of the chip carrier, the chip carrier comprising:

a core layer having a plurality of conductive traces formed on at least one surface thereof, the conductive traces comprising:

at least one first trace connected with the passive component and having a first predetermined position and two ends, wherein the two ends are respectively electrically connected to a first bond finger formed on the surface, mounted with the passive component, of the chip carrier, and to a first ball pad formed on an opposite surface of the chip carrier, and wherein the first predetermined position and the first bond finger are located on the same side relative to the passive component; and at least one second trace free of connection with the passive component and having two ends and a second predetermined position located on the same surface as the first predetermined position, wherein one of the ends of the second trace is electrically connected to a second ball pad located on the same surface as the first ball pad; and a solder mask layer applied over the conductive traces and formed with a plurality of openings for at least exposing the first predetermined position and the second predetermined position.

2. The chip carrier of claim 1, wherein the passive component is a resistor.

3. The chip carrier of claim 1, wherein the passive component is an inductor.

4. The chip carrier of claim 1, wherein each of the first predetermined position and the second predetermined position is at least formed with a nickel/gold (Ni/Au) layer thereon.

5. The chip carrier of claim 1, wherein the chip carrier is a substrate.

6. The chip carrier of claim 1, wherein the passive component is serially connected to the first trace by means of surface mount technology (SMT).

7. The chip carrier of claim 1, wherein the core layer is made of a material selected from the group consisting of FR4 resin, glass resin, BT (bismaleimide triazine) resin, epoxy resin, polyimide resin, and cyanide resin.

8. A method for testing electrical performance of a passive component, for use with a chip carrier having a core layer on which a plurality of conductive traces are formed, the conductive traces comprising at least one first trace predetermined to be connected with the passive component, the method comprising the steps of:

setting a first predetermined position on the first trace, and allowing two ends of the first trace to be respectively electrically connected to a first bond finger formed on a surface, mounted with the passive component, of the chip carrier, and to a first ball pad formed on an opposite surface of the chip carrier, wherein the first predetermined position and the first bond finger are located on the same side relative to the passive component;

setting a second trace from the plurality of conductive traces and a second predetermined position on the second trace, wherein the second trace is predetermined free of connection with the passive component, and one end of the second trace is connected to a second ball pad formed on the same surface as the first ball pad;

applying a solder mask layer over the conductive traces and forming a plurality of openings through the solder mask layer for at least exposing the first predetermined position and the second predetermined position;

mounting the passive component on the first trace;

interconnecting the first predetermined position and second predetermined position via an electrically conductive material; and contacting two test heads respectively with the first ball pad and second ball pad, which are situated on the same surface of the chip carrier, to testing the electrical performance of the passive component.

9. The method of claim 8, wherein the electrically conductive material is a conductive jig made by conductive rubber.

10. The method of claim 8, wherein the electrically conductive material is a conductive jig made by a conductive metal.

11. The method of claim 8, wherein the passive component is a resistor.

12. The method of claim 8, wherein the passive component is an inductor.

13. The method of claim 8, wherein each of the first predetermined position and the second predetermined position is at least formed with a nickel/gold (Ni/Au) layer thereon.

14. The method of claim 8, wherein the chip carrier is a substrate.

15. The method of claim 8, wherein the passive component is serially connected to the first trace by means of surface mount technology (SMT).

16. The method of claim 8, wherein the core layer is made of a material selected from the group consisting of FR4 resin, glass resin, BT (bismaleimide triazine) resin, epoxy resin, polyimide resin, and cyanide resin.

17. The method of claim 8, wherein the test head is a test probe of a testing system.

* * * * *